United States Patent
Fukuizumi et al.

(10) Patent No.: US 6,613,829 B2
(45) Date of Patent: Sep. 2, 2003

(54) CONDUCTIVE HARDENING RESIN FOR A SEMICONDUCTOR DEVICE AND SEMICONDUCTOR DEVICE USING THE SAME

(75) Inventors: Akira Fukuizumi, Tokyo (JP); Kazuto Oonami, Tokyo (JP)

(73) Assignees: NEC Electronics Corporation, Kanagawa (JP); Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 10/052,633

(22) Filed: Jan. 23, 2002

(65) Prior Publication Data

US 2002/0098625 A1 Jul. 25, 2002

(30) Foreign Application Priority Data

Jan. 23, 2001 (JP) .................. 2001-015005
Dec. 4, 2001 (JP) .................. 2001-370649

(51) Int. Cl.[7] .............. C08J 3/00; C08K 3/08; C08L 37/00; C08L 39/00; C08L 33/00
(52) U.S. Cl. ............ 524/439; 524/548; 524/556; 524/560; 524/561; 524/612
(58) Field of Search ................. 524/439, 548, 524/556, 560, 561, 612

(56) References Cited

U.S. PATENT DOCUMENTS 5,667,884 A * 9/1997 Bolger

FOREIGN PATENT DOCUMENTS

JP    2000-114445    4/2000

* cited by examiner

Primary Examiner—Patrick D. Niland
(74) Attorney, Agent, or Firm—Young & Thompson

(57) ABSTRACT

Conductive hardening resin for a semiconductor device of the present invention contains metal powder for providing electric conduction between electrodes positioned on the front of a semiconductor chip and a wiring material including lead terminals via a conductive plate. The resin has a modulus of elasticity of $2.0 \times 10^9$ Pa or below when hardened. The resin prevents the contact resistance of the metal plate, lead terminals and semiconductor chip from increasing in the event of temperature cycling tests and a pressure cooker tests. Further, the resin frees the metal plate and chip from peel-off and corrosion, respectively.

13 Claims, 6 Drawing Sheets

| MODULUS OF ELECTROCITY ($10^6$ Pa) | 480 | 1000 | 1700 | 2000 | 3900 | 4700 | 5000 | 7300 |
|---|---|---|---|---|---|---|---|---|
| PEELING | ○ | ○ | ○ | ○ | × | × | × | × |

Fig. 6B

| pH | 4 | 5 | 6 | 7 |
|---|---|---|---|---|
| CORROSION OF ELECTRODES | (4.1) ×<br>(4.3) ×<br>(4.5) ×<br>(4.7) ×<br>(4.8) × | (5.0) ○<br>(5.1) ○<br>(5.4) ○<br>(5.5) ○ | (6.2) ○<br>(6.5) ○ | |

CONDUCTIVE HARDENING RESIN FOR A SEMICONDUCTOR DEVICE AND SEMICONDUCTOR DEVICE USING THE SAME

BACKGROUND OF THE INVENTION

1. Field of the Invention

The present invention relates to a semiconductor device sealed with molding resin, i.e., a plastic package. More particularly, the present invention relates to a plastic package in which a copper plate or similar metal plate provides electric connection between the electrodes of a semiconductor chip and lead terminals.

2. Description of the Background Art

It is a common practice with a plastic package to mount a semiconductor chip to the island portion of a lead frame, connect the inner leads of the lead frame and electrodes formed on the front of the chip with gold wires or similar bonding wires, and then seal the entire assembly with molding resin. When the chip is mounted to the island portion, use is made of a die bonding material implemented by conductive resin consisting of epoxy resin and silver filled therein. The die bonding material is introduced between the chip and the island portion and then hardened by baking. The bonding wires are connected by the combination of thermo-compression bonding and ultrasonic wave. When a power transistor or similar power device for great current applications should be sealed by the method described above, the bonding wires formed of gold are increased in diameter for lowering wiring resistance.

The conventional semiconductor device described above has sufficient reliability as determined by TCTs (Temperature Cycling Tests) and PCTs (Pressure Cooker Tests). However, the problem is that gold increases the cost of the semiconductor device with an increase in the size of the power device, limiting the diameter of the bonding wires. In light of this, Japanese Patent Laid-Open Publication No. 2000-114445 proposes a method that connects the electrodes of a semiconductor chip and the source terminal of a lead frame with a metal plate instead of a bonding wire.

We conducted a series of researches and experiments with the method taught in the document mentioned above and found that the method had some problems left unsolved, as will be described specifically later.

SUMMARY OF THE INVENTION

It is an object of the present invention to provide conductive hardening resin for a semiconductor device that frees the electrodes of a semiconductor chip, a wiring member (lead frame) and a metal plate from peeling even in the event of TCTs and PCTs and prevents conductivity from being lowered.

Conductive hardening resin for a semiconductor device of the present invention contains metal powder for providing electric conduction between electrodes positioned on the front of a semiconductor chip and a wiring material including lead terminals via a conductive plate. The resin has a modulus of elasticity of $2.0 \times 10^9$ Pa or below when hardened.

A semiconductor device using the above resin is also disclosed.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1A:
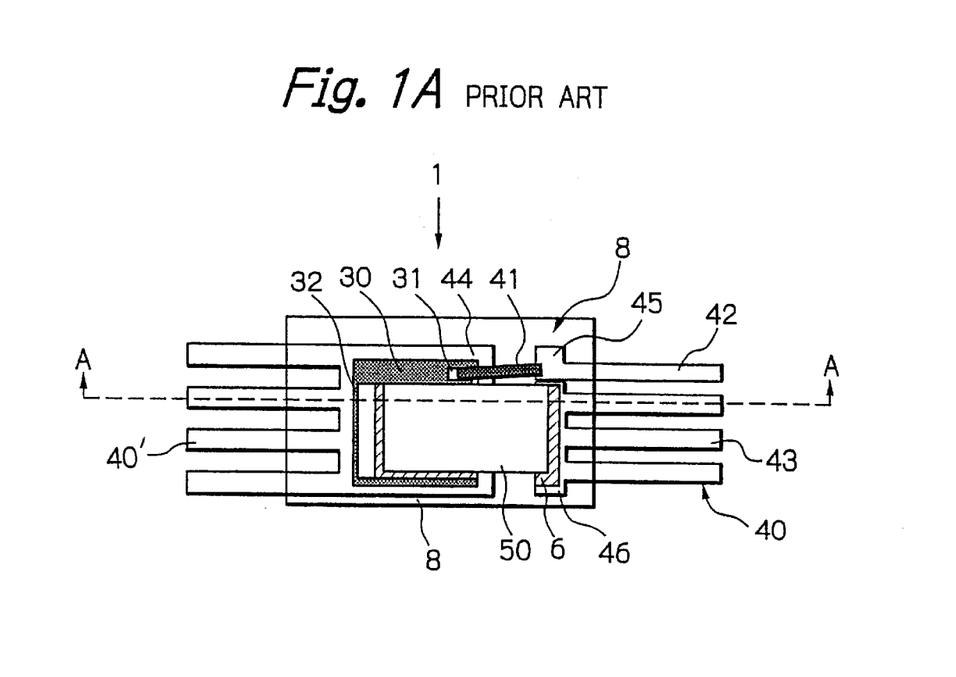
FIG. 1A is a plan view showing a conventional semiconductor device.
Figure 1B:
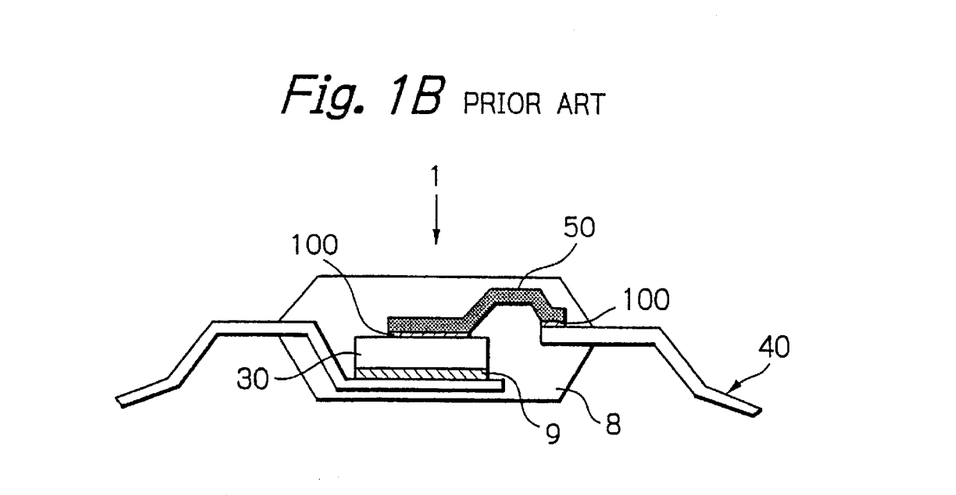
FIG. 1B is a section along line A—A of FIG. 1A.

To better understand the present invention, the results of experiments that we conducted with the method taught in Laid-Open Publication No. 2000-114445 mentioned earlier will be described first. FIGS. 1A and 1B show the structure of a semiconductor device used for the experiments. As shown, the semiconductor device, generally 1, includes a semiconductor chip 30 constituting a MOSFET (Metal Oxide Semiconductor Field Effect Transistor). The semiconductor chip 30 is mounted and connected to an island portion 44 by conductive hardening resin 100. Subsequently, a gate electrode or current control electrode 31 through which a great current does not flow is connected to a gate terminal 45 by a bonding wire 41. On the other hand, a source electrode or current electrode 32 through which a great current flows is connected to a source terminal 46 by the conductive resin 100 via a metal plate 50. Thereafter, the entire assembly is sealed with molding resin 8 to thereby complete an eight-pin SOP (Small Outline Package). The gate electrode 31 and source electrode 32, which has a large area, are positioned on the top of the semiconductor chip 30 while a drain electrode, not shown, is formed on the bottom of the chip 30.

A lead frame 40 has outer leads extending out from opposite sides of the package. Specifically, four drain leads 40' protrude from the lead frame 40 to the outside of the molding resin 8 at the left-hand side as viewed in FIG. 1A. A single gate lead 42 and three source leads 43 protrude from the lead frame 40 to the outside of the molding resin 8 at the right-hand side as viewed in FIG. 1A. The drain leads 40' are formed integrally within the package, forming the island portion 44. The gate lead 42 has the gate terminal 45 within the package. The source leads 43 are formed integrally within the package and have a single, broad source terminal 46. The reference numeral 9 designates a die bonding material.

The lead frame 40 is formed of copper or a copper alloy. The front of the island portion 44 and the back of the chip are plated with silver. The electrodes on the semiconductor surface are coated with TiNiAg, which is solder-wettable metal. The metal plate 50 is formed of copper and provided with a width about one-half of the contour size of the package.

Experiments showed that the metal plate 50 of the semiconductor device 1 improved an electric characteristic and heat radiation more than a bonding wire because of a decrease in wiring resistance.

We conducted TCTs and PCTs with semiconductor devices each having the configuration shown in FIGS. 1A and 1B in order to produce them on a quantity basis. At first, we thought that all the semiconductor devices should pass the test without any problem because silver-filled conductive epoxy resin had long been used in the past, because the production process was almost conventional, and because a metal plate was simply substituted for a bonding wire. More specifically, the source wiring appeared to be equivalent to connecting a semiconductor chip and a die mount with silver-filled epoxy resin hardened by baking, which had given actual results in the reliability aspect. Moreover, bonding a gate electrode and a lead frame with a gold wire had also given actual results. This is why we thought the structure of FIGS. 1A and 1B was a simple combination of the conventional technologies.

The tests, however, showed that most of the products were defective. Specifically, although the products had a good electric characteristic before the tests, the wiring resistance of, e.g., the terminal leads appeared as if it were raised after the tests. By using acoustic microscopy, package unsealing and other analyzing means, we examined the cause of the above occurrence. It was found that the source electrode and metal plate were held in loose contact or, in the worst case, the metal plate was peeled off the chip electrode. On the other hand, the semiconductor chip was not peeled off the island portion at the back thereof. Moreover, corrosion was found that was presumably ascribable to a great amount of water entered along the interface between the molding resin and the metal plate, which increased the wiring area, compared to a bonding wire.

Extended researches and experiments showed that only the front of the semiconductor surface came off after temperature cycles because aluminum on the front surface was softer than silver and copper. As a result, during temperature cycles, stress derived from a difference in the coefficient of thermal expansion between the metal plate and silicon caused the aluminum electrode to plastically deform sideways. The repeated temperature cycle finally destroyed the interface between the aluminum electrode and the chip and solder-wettable metal. While this problem can therefore be solved if the above stress is absorbed or obviated by some method, it is extremely difficult to obviate the stress. We reached a conclusion that the stress should be absorbed by lowering the modulus of elasticity of the conductive resin, which connected the electrode on the front of the semiconductor and the metal plate.

More specifically, the prerequisite with silver-filled epoxy, conductive hardening resin conventionally used as a die bonding material is that its modulus of elasticity be high enough to sufficiently transfer ultrasonic oscillation to the electrodes on the chip when the electrodes and the terminals of the lead frame are connected by wire bonding (e.g. $8.9 \times 10^9$ Pa). As a result, the resin hardened by baking was excessively rigid, as determined by experiments. Experiments covered even a range not used in the past proved that the modulus of elasticity should be $2.0 \times 10^9$ Pa or below. Such a low modulus of elasticity allowed the conductive resin to be as soft as rubber and absorbed the stress even when the stress occurred during temperature cycles, thereby obviating the peel-off.

Figure 2A:
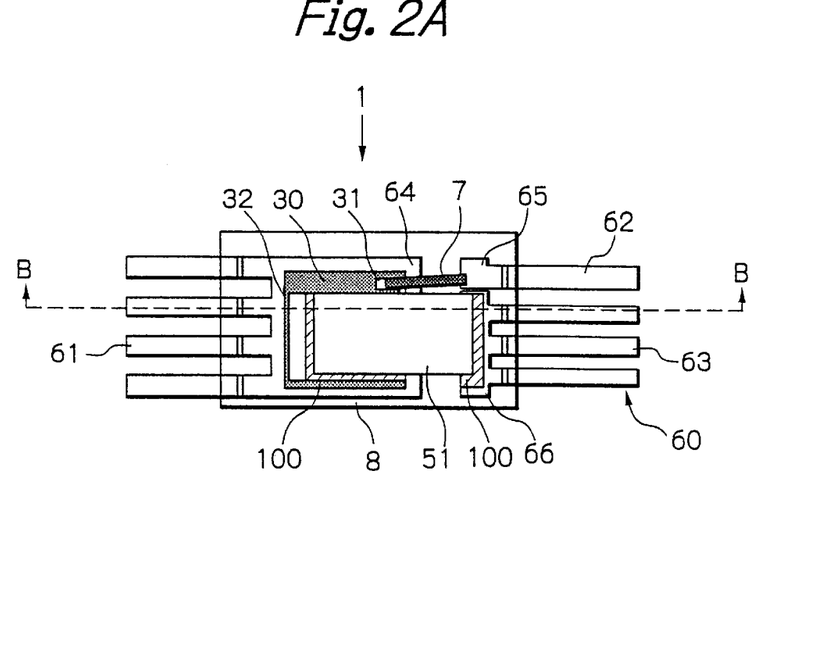
FIG. 2A is a plan view showing a semiconductor device embodying the present invention.
Figure 2B:
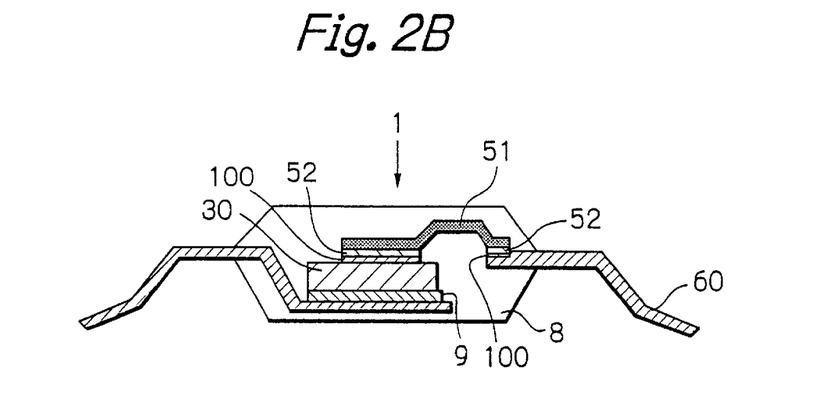
FIG. 2B is a section along line B—B of FIG. 2A.

Referring to FIGS. 2A and 2B, conductive hardening resin and semiconductor device embodying the present invention will be described. As shown, a semiconductor device, generally 1, includes a semiconductor chip 30 constituting a MOSFET and mounted and connected to a lead frame 60. A bonding wire formed of, e.g., gold 7 and a copper plate or metal plate 51 set up electrical connection between the chip 30 and lead frame 60. Subsequently, the entire assembly is sealed with epoxy resin or similar seal resin 8, completing an eight-pin SOP.

A gate electrode 31 and a source electrode 32, which has a large area, are formed on the front or top of the chip 30. A drain electrode, not shown, is formed on the bottom or back of the chip 30. Such electrodes are implemented by aluminum, aluminum alloy, gold, gold plating, silver plating or similar plating including Ti/Ni or similar underlying plated film, or a metalized combination of such metals.

The lead frame 60 has outer leads extending out from opposite sides of the package. Specifically, four drain leads 61 protrude from the lead frame 60 at the left-hand side while a single gate lead 62 and three source leads 63 protrude from the lead frame 60 at the right-hand side as viewed in FIG. 2A. The drain leads 61 are formed integrally within the package, forming an island portion 64. The gate lead 62 has a gate terminal 65 within the package. The source leads 63 are formed integrally within the package and have a single, broad source terminal 66.

The chip 30 is bonded to the island portion 64 by a die bonding material 9 with a drain electrode, not shown, thereof being electrically connected to the island portion 64. Part of the chip 30 to be mounted to the island portion 64 may be plated with silver, if desired. The bonding wire 7 connects the gate lead 31 on the front of the chip 30 and the gate terminal 65 of the lead frame 60. The copper plate 51 connects the source electrode 32 and the source terminal 66 of the lead frame 60. The copper plate 51 is connected at one end to the source terminal 32 via conductive hardening resin 100 and at the other end to the source terminal via the resin 100. The copper plate 51 sets up electrical connection between the source electrode 32 and the source terminal 66.

The chip 30, island portion 64, gate terminal 65, source terminal 66, bonding wire 7 and copper plate 51 are sealed with molding resin 8 and packaged thereby. The leads protruding from the molding resin 8 constitute outer terminals.

The conductive hardening resin 100 is adhesive made up of acrylic resin or similar resin, which is a major component, and a hardener and silver powder or similar conductive material filled in the resin. In the illustrative embodiment, the resin 100 has a low modulus of elasticity for reducing the thermal stress stated earlier. Further, the resin 100 used to provide conduction between the electrodes of the chip 30 and lead frame 60 and the copper plate 51 should contain a minimum of components that would cause the above electrodes whose major component is aluminum to corrode. It therefore follows that the resin 100 itself must be provided with pH that does not cause the electrodes of the chip 30 to corrode as far as possible; pH should preferably range from 5 to 8, more preferably from 5.0 to 6.5.

The copper plate 51 is formed of copper or copper alloy. While the copper plate 51 may be replaced with a metal plate formed of, e.g., Fe-Ni42 alloy, copper alloy is desirable from the conductivity and heat radiation standpoint. As shown in FIG. 2A, the copper plate 51 is a thin, strip-like plate whose width is about one-half of the contour size of the package. As shown in FIG. 2B, the copper plate 51 includes two flat portions respectively contacting the source electrode 32 and source terminal 66 and a bent tie portion connecting the flat portions. The copper plate 51 may be formed by pressing. The top of the copper plate 51 opposite to the source electrode 32 and source terminal 66 should preferably be roughened so as to contact the molding resin 8 over a broader area. The bottom of the copper plate 51 is partly plated with silver 52 for enhancing conductivity.

To further enhance the effects of the illustrative embodiment, it is preferable that at least two of the chip 30, metal plate 51 and wiring material and the molding resin 8 be bonded or otherwise closely connected together. More specifically, in the illustrative embodiment, it is preferable to form, e.g., dimples in the top of the copper plate 51 for the roughening purpose and to form, e.g., grooves in the surfaces of the chip 30, copper plate 51 and wiring material that mate with the molding resin 8.

The dimples mentioned above may be formed in the copper plate 51 by half-etching or pressing. Full-etching would cause much copper to be removed and would thereby increase the resistance of the copper plate 51. However, if importance is not attached to the resistance of the copper plate 51, then full-etching may be used, in which case through holes will be substituted for the dimples. Through holes are also successful to enhance close contact with the molding resin 8.

The silver plating 52 on the bottom of the copper plate 51 frees the plate 51 from oxidation, maintains the conductivity of the plate 51, and lowers contact resistance between the plate 51 and the source electrode 32 and source terminal 66. The silver plating 52 is not applied to the entire bottom of the copper plate 51, but is applied to the copper plate 51 and lead frame 60 only at portions where the plate 51 contacts the source electrode 32 and source terminal 66. The top of the copper plate 51 is not plated with silver at all.

In the configuration shown in FIGS. 2A and 2B, the molding resin 8 is partly filled in the dimples and hardened. This enhances close contact between the copper plate 51 and the molding resin 8 and therefore the reliability of the semiconductor device 1. Alternatively, the top of the copper plate 51 may be roughened by sand-blast, chemical polishing or similar technology, in which case the molding resin 8 will be partly filled in the fine recesses of the plate 51. This is also successful to enhance close contact between the copper plate 51 and the molding resin 8 and therefore the reliability of the semiconductor device 1.

Further, to roughen the top of the copper plate 51, needle-like plating may be provided on the top of the plate 51, in which case the molding resin 8 will be filled in the plate 51 even around the fine needle-like plating. This also achieves the advantages described above.

Figure 3A:
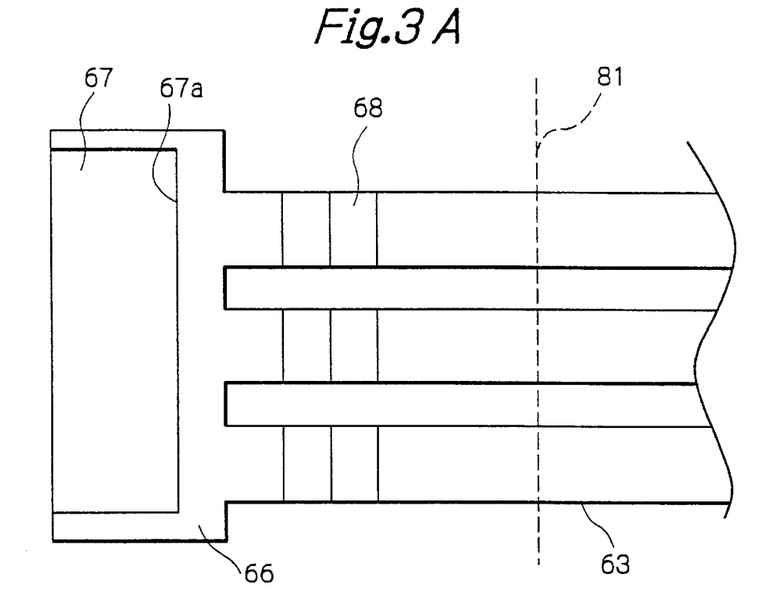
FIG. 3A is a plan view showing a source lead included in a lead frame applied to the illustrative embodiment.
Figure 3B:
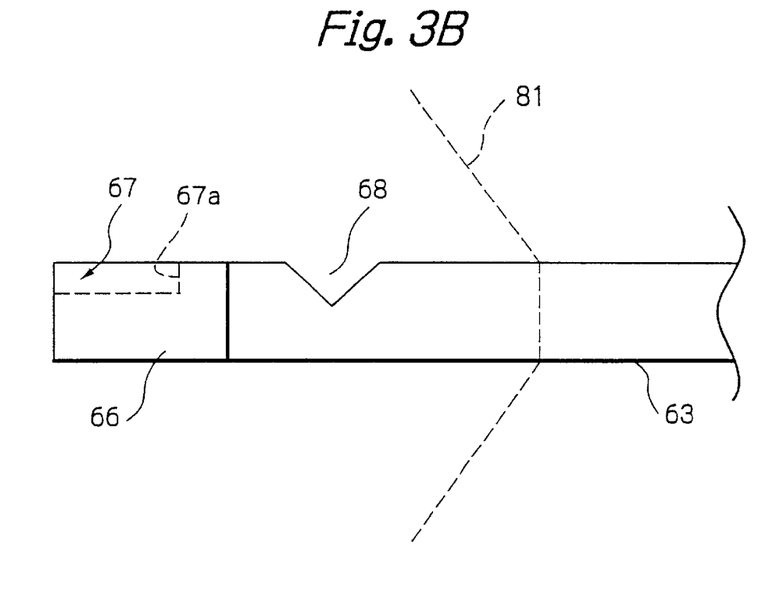
FIG. 3B is a side elevation of the source lead.

As shown in FIGS. 3A and 3B, the lead frame 60 includes a stepped portion 67 and notches 68 having a generally V-shaped cross-section each. More specifically, the source terminal 66 is formed with the stepped portion 67. The source terminal 66 is elongate in the direction parallel to the contour 81 of the package and has three source leads 63 configured integrally with each other. The stepped portion 67, which is lower in level than the top of the source terminal 66, has a wall 67a standing upright, as seen in the direction in which the source leads 63 extend from the source terminal 66. The wall 67a extends in parallel to the contour 81 of the package, but perpendicularly to the source leads 63. The notches 68 each are formed in one of the three source leads 63 and extend in parallel to the package contour 81, but perpendicularly to the source leads 63.

A conventional lead frame lacks the stepped portion 67 and notches 68. Therefore, during a sequence of steps of printing or coating solder paste or conductive hardening resin on a source terminal, mounting a metal plate to the paste or the resin and then effecting reflow or curing, the resin is apt to flow along source leads as far as the contour 81 of the package or even over the contour 81. This degrades close contact between the source leads and molding resin and therefore the reliability of a semiconductor device.

By contrast, in the illustrative embodiment, the stepped portion 67 prevents the solder paste or the conductive hardening printed or coated on the bottom of the stepped portion 67 from flowing out onto the source leads 63 with its wall 67a. Even if the resin flows out of the stepped portion 67 over the wall 67a, the notches 68 stop it. In this manner, the stepped portion 67 and notches 68 insure close contact between the source leads 63 and the molding resin 8 and therefore the reliability of the semiconductor device 1.

The stepped portion 67 and notches 68 may be formed during the pressing of the lead frame 60. While the stepped portion 67 is formed by smashing part of the source terminal 66, it may alternatively be formed by bending the source terminal 66. While the stepped portion 67 may even be replaced with a groove having a U-shaped cross-section, such a groove is apt to cause the resin to overflow the groove and flow toward the outside of the package along the source leads 63. More specifically, the stepped portion 67 does not have a wall that obstructs the flow of the resin toward the inside of the package and therefore allows excess resin to flow inward.

Moreover, part of the molding resin 8 fills up the notches 68 formed in the source leads 63 and hardens therein, promoting close contact between the lead frame 60 and the molding resin 8. For the same purpose, the drain leads 61 and gate lead 62 each are also formed with the V-shaped notch 68 adjoining the edge of the package.

Figure 4A:
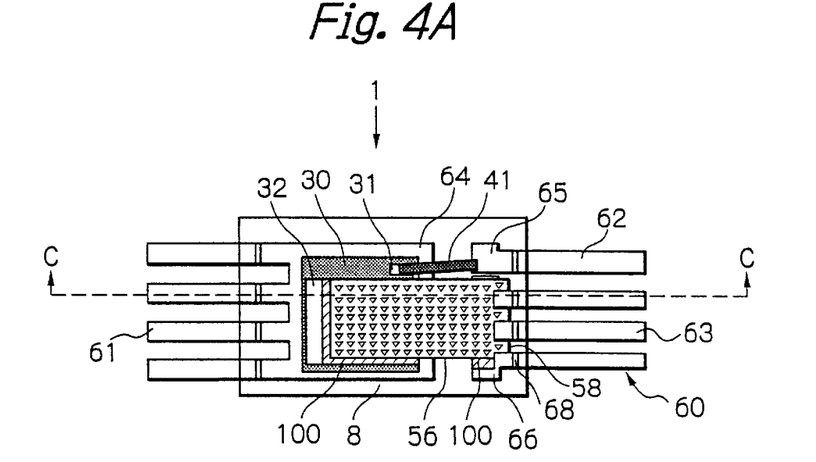
FIG. 4A is a plan view showing an alternative embodiment of the present invention.
Figure 4B:
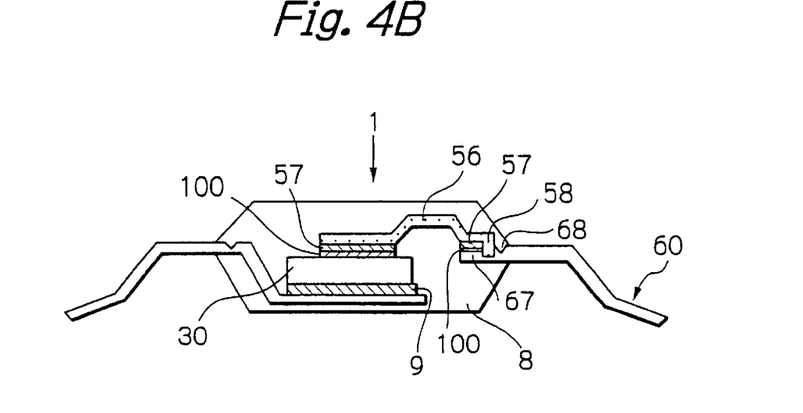
FIG. 4B is a section along line C—C of FIG. 4A.
Figure 5A:
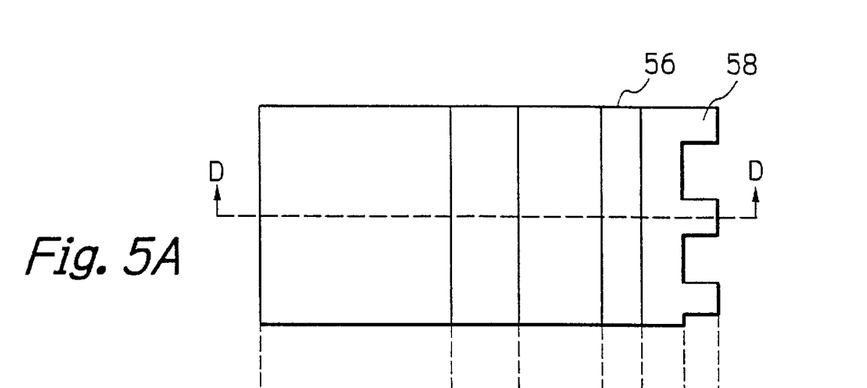
FIG. 5A is a plan view showing a copper plate included in the alternative embodiment.
Figure 5B:
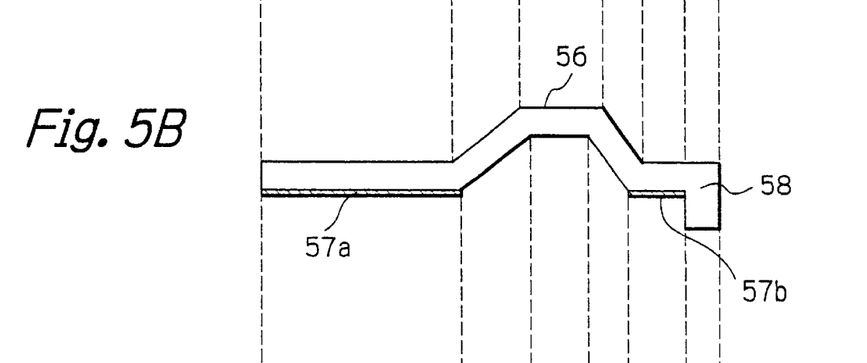
FIG. 5B is a section along line D—D of FIG. 5A.
Figure 5C:
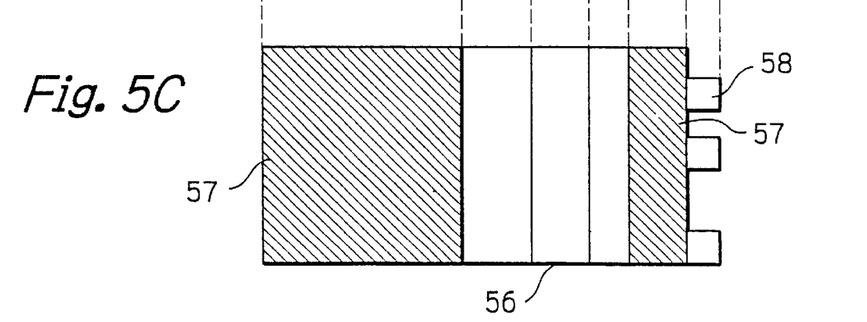
FIG. 5C is a bottom view of the copper plate.

Reference will be made to FIGS. 4A, 4B and 5 for describing an alternative embodiment of the present invention. As shown, this embodiment is similar to the previous embodiment except that the copper plate 56 is formed with three claws 58. As shown in FIG. 5, the copper plate 51, like the copper plate 51 of the previous embodiment, is plated with silver at portions 57a and 57b thereof. The portions 57a and 57b respectively contact the source electrode 32 and source terminal 66. The top of the copper plate 56 is not plated with silver at all.

As shown in FIG. 5B, the three claws 58 extend downward from the edge of the copper plate 56, which adjoins the source leads 63, below the plated portion 57b. The second and third claws 58 from the top, as seen in FIGS. 4A and 5A, each are positioned between nearby ones of the three source leads 63. The top claw 58, as seen in FIGS. 4A and 5A, is positioned between the gate lead 62 and the source lead 63 adjoining it, but does not contact the gate lead 62. The top claw 58 is engaged with the source leads 63 together with the other claws 58. The claws 58 may be formed during the pressing of the copper plate 56.

At the time of mounting of the copper plate 56, the claws 58 are inserted between the leads. This allows the copper plate 56 to be accurately positioned on the source electrode 32 and source terminal 66 of the chip 30.

A specific example of the illustrative embodiments will be described hereinafter. As shown in FIGS. 2A and 2B, the semiconductor device 1 is an eight-pin SOP including the semiconductor chip 30 that constitutes a MOSFET. After the chip 30 has been mounted and connected to the lead frame 60, electric connection is set up by the gold wire or similar bonding wire 7 and copper plate or metal plate 51.

Subsequently, the entire assembly is sealed with the epoxy resin or similar molding resin 8. The gate electrode 31 and source electrode 32, which has a large area, are positioned on the front of the chip 30 while the drain electrode, not shown, is positioned on the back of the chip 30. The gate electrode 31 and drain electrode are formed of aluminum.

The lead frame 60 has outer leads extending out from opposite sides of the package. Specifically, four drain leads 61 protrude from the lead frame 60 at the left-hand side while a single gate lead 62 and three source leads 63 protrude from the lead frame 60 at the right-hand side as viewed in FIG. 2A. The drain leads 61 are formed integrally within the package, forming an island portion 64. The gate lead 62 has a gate terminal 65 within the package. The source leads 63 are formed integrally within the package and have a single, broad source terminal 66.

The chip 30 is bonded to the island portion 64 by the die bonding material 9 with its drain electrode, not shown, being electrically connected to the island portion 64. Part of the chip 30 to be mounted to the island portion 64 is plated with silver, if desired. The bonding wire 7 connects the gate lead 31 on the top of the chip 30 and the gate terminal 65 of the lead frame 60. The copper plate 51 connects the source electrode 32 and the source terminal 66 of the lead frame 60. The copper plate 51 is connected at one end to the source terminal 32 via conductive hardening resin 100 and at the other end to the source terminal via the resin 100. The copper plate 51 sets up electrical connection between the source electrode 32 and the source terminal 66. The conductive hardening resin 100 is adhesive made up of acrylic resin, which is a major component, and a hardener and silver powder filled in the resin.

The chip 30, inner leads (including the island portion 64, gate terminal 65 and source terminal 66), bonding wire 7 and copper plate 51 are sealed with the molding resin 8 and packaged thereby. The lead portions protruding to the outside of the molding resin 8 constitute outer leads.

Figure 6A:
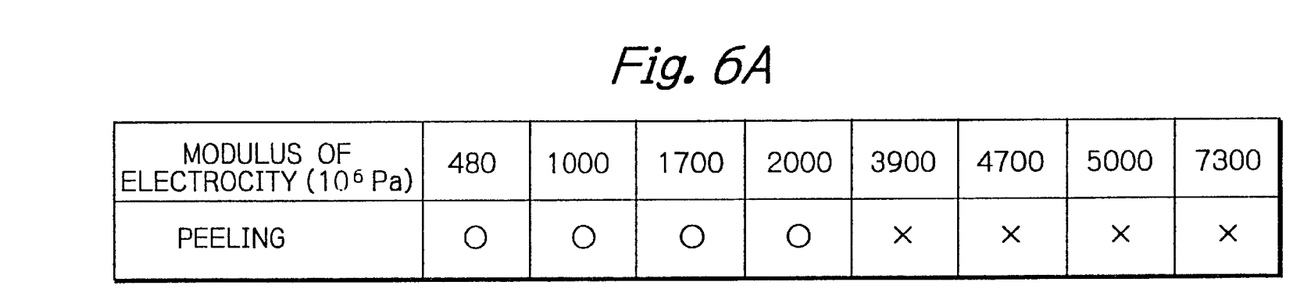
FIGS. 6A and 6B are tables listing the results of reliability tests conducted with the illustrative embodiments.
Figure 6B:
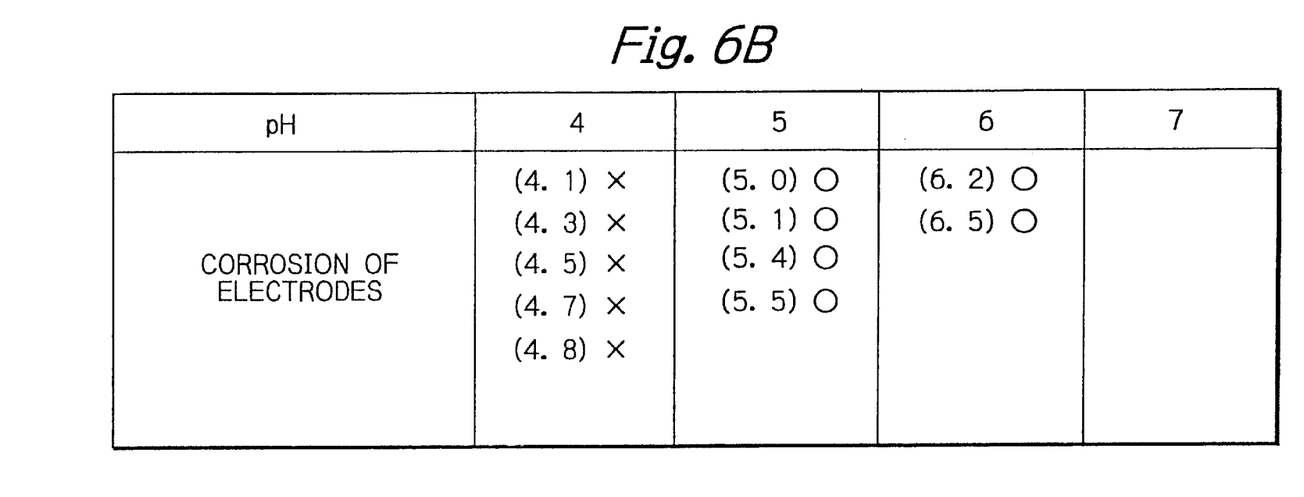

FIGS. 6A and 6B show the results of reliability tests conducted with the semiconductor device 1. Specifically, a TCT was conducted by 300 cycles at temperature ranging from +150° C. to −60° C. while a PCT was conducted at temperature of 85° C., humidity of 85% and elasticity of 0.23×106 Pa for 384 hours. FIG. 6A shows a relation between the modulus of elasticity of the conductive hardening resin and the peel-off of the metal plate. FIG. 6B shows a relation between pH of the conductive hardening resin and the corrosion of the electrodes. In FIG. 6A, circles and crosses respectively indicate "no peeling" and "peeling" determined by eye and tests based on an electric characteristic. Also, in FIG. 6B, circles and crosses respectively indicate "no corrosion" and "corrosion" determined by tests based on an electric characteristic.

In FIG. 6A, the modulus of elasticity of the conductive hardening resin was measured by DMA (Dynamic Mechanical Analysis) at 25° C. As shown in FIG. 6A, when the modulus of elasticity was $2.0 \times 10^9$ Pa or below, the metal plate did not peel off. This proves that such a modulus of elasticity prevents the metal plate from coming off despite the extraneous stress, guaranteeing the reliability of the semiconductor device 1. As FIG. 6A indicates, while the above modulus of elasticity is preferable, the effective range of the modulus of elasticity may extend from $2.0 \times 10^9$ Pa to $3.9 \times 10^9$ Pa.

To measure pH shown in FIG. 6B, a sample of conductive resin for a semiconductor device was hardened and diluted by pure water heated to 125° C. by twenty times for 20 hours. As FIG. 6B indicates, aluminum did not corrode when the pH of the above solution was between 5.0 and 6.5. Further, aluminum did not corrode when the Na ion concentration, Cl ion concentration and P ion concentration of the solution were less than 2 ppm, less than 3 ppm and less than 0.1 ppm, respectively. This means that Na ions, Cl ions and P ions should preferably not exist in the solution in a detectable amount each. It may therefore be said that when the electrodes formed of aluminum, they are free from corrosion if pH of the solution lies in the above particular range and if the Na, Cl and P ion concentrations of the solution do not exceed the above particular values.

While the illustrative embodiments have concentrated on a MOSEFT, the present invention is, of course, applicable to a bipolar device.

In summary, it will be seen that the present invention provides conductive hardening resin for a semiconductor device and a semiconductor device using the same that prevent the contact resistance of a metal plate, lead terminals and a semiconductor chip from increasing in the event of TCTs and a PCTs, which lie in an allowable range as reliability tests. Further, the metal plate and chip are free from peel-off and corrosion, respectively. Molding resin can therefore closely contact the semiconductor device and therefore tightly seal it against water and gases, thereby enhancing the reliability and yield of semiconductor devices.

Various modifications will become possible for those skilled in the art after receiving the teachings of the present disclosure without departing from the scope thereof.

What is claimed is:

1. A conductive hardening resin containing metal powder for providing electric conduction between electrodes positioned on a front of a semiconductor chip, which is included in a semiconductor device, and a wiring material including lead terminals via a conductive plate, said resin having a modulus of elasticity of $2.0 \times 10^9$ Pa or below when hardened.

2. The resin as claimed in claim 1, wherein an Na ion concentration, a Cl ion concentration and a P ion concentration are less than 2 ppm, less than 3 ppm and less than 0.1 ppm, respectively.

3. The resin as claimed in claim 1, wherein pH is between 5.0 and 8.0 as measured by a method that dilutes a hardened sample with pure water by 20 times.

4. The resin as claimed in claim 3, wherein an Na ion concentration, a Cl ion concentration and a P ion concentration are less than 2 ppm, less than 3 ppm and less than 0.1 ppm, respectively.

5. The resin as claimed in claim 1, wherein pH is between 5.0 and 8.0 as measured by a method that dilutes a hardened sample with pure water by 20 times.

6. The resin as claimed in claim 5, wherein an Na ion concentration, a Cl ion concentration and a P ion concentration are less than 2 ppm, less than 3 ppm and less than 0.1 ppm, respectively.

7. The resin as claimed in claim 1, wherein said resin comprises either one of epoxy resin and acrylic resin.

8. The resin as claimed in claim 1, wherein pH is between 5.0 and 8.0 as measured by a method that dilutes a hardened sample with pure water by 20 times.

9. The resin as claimed in claim 8, wherein an Na ion concentration, a Cl ion concentration and a P ion concentration are less than 2 ppm, less than 3 ppm and less than 0.1 ppm, respectively.

10. The resin as claimed in claim 1, wherein said metal power comprises silver powder.

11. The resin as claimed in claim 10, wherein said resin comprises either one of epoxy resin and acrylic resin.

12. The resin as claimed in claim 1, wherein pH is between 5.0 and 8.0 as measured by a method that dilutes a hardened sample with pure water by 20 times.

13. The resin as claimed in claim 12, wherein an Na ion concentration, a Cl ion concentration and a P ion concentration are less than 2 ppm, less than 3 ppm and less than 0.1 ppm, respectively.

* * * * *